United States Patent [19]
Norrod

[11] Patent Number: 5,121,397
[45] Date of Patent: Jun. 9, 1992

[54] METHOD AND APPARATUS FOR PRODUCING ORDER INDEPENDENT SIGNATURES FOR ERROR DETECTION

[75] Inventor: Forrest E. Norrod, Fort Collins, Colo.

[73] Assignee: Hewlett-Packard Company, Palo Alto, Calif.

[21] Appl. No.: 480,417

[22] Filed: Feb. 14, 1990

[51] Int. Cl.⁵ ............................................. G06F 11/08
[52] U.S. Cl. ..................... 371/54; 371/49.1; 371/53
[58] Field of Search ................. 371/53, 54, 49.1, 49.2

[56] References Cited

U.S. PATENT DOCUMENTS 4,142,243  2/1979  Bishop et al. ..................... 371/53 X

OTHER PUBLICATIONS

Alan M. Usas, "Checksum Versus Residue Codes For Multiple Error Detection", *IEEE Computer Society*, Digest of Papers on the Eighth Annual International Conference on Fault-Tolerant Computing, p. 224 (1978).

Scewiorek and Swarz, "The Theory and Practice of Reliable System Design", pp. 101 et seq. Digital Press (1982).

Primary Examiner—Jerry Smith
Assistant Examiner—Allen M. Lo
Attorney, Agent, or Firm—Guy J. Kelley

[57] ABSTRACT

A method and apparatus for detecting errors in communicated data words irrespective of the order in which the data words are communicated. In a system wherein a set of N bit data words are transferred from a source end to a receiver end over a communications medium, a method for detecting errors in received data words comprises the following steps: (a) summing data words to be transferred by accumulating the data words in N bit locations of a first N+1 bit register while storing any carry outs ("COs") in a reserved one of the N+1 bit locations, the contents of the first N+1 bit register defining an expected signature SE; (b) summing received data words received by accumulating the received data words in N bit locations of a second N+1 bit register while storing any COs in a reserved one of the N+1 bit locations of the second N+1 bit register, the contents of the second N+1 bit register defining an error detection signature S; and (c) comparing S and SE and providing an indication that an error has occurred in the data transfer when a discrepancy is detected.

16 Claims, 1 Drawing Sheet

METHOD AND APPARATUS FOR PRODUCING ORDER INDEPENDENT SIGNATURES FOR ERROR DETECTION

FIELD OF THE INVENTION

The present invention relates generally to the field of communicating or transmitting digital data from one location to another, such as over a data channel. More particularly, the present invention relates to a method and apparatus for detecting data transfer errors.

BACKGROUND OF THE INVENTION

In modern data processing and communication systems, it is often desirable to transfer data between separate and often disparate devices. A common problem arises in such systems when data transferred from a sending device (or "source") to a receiving device (or "receiver") is distorted in some way before reaching its destination. The distortion has various possible causes, including environmental noise (in the case of radio frequency systems), defective or noisy transmission lines, or a defective data channel, or "bus". The later is a particularly common source of error in digital systems. Since there is no currently available means of ensuring 100% error-free data transfer, the system designer must endeavor to provide means for detecting errors when they occur and taking appropriate action.

Two well known error detection methods employed are the checksum and CRC methods. Both involve computing a "signature" for blocks of data words to be transmitted. As a block of data words (or "data set") is sent over the bus, means are provided at the source end of the bus for computing a quasi-unique word representing the data set. This quasi-unique word is called a "signature". When computed at the source end of the bus, it is called an "expected signature" ("SE"). A similar signature is computed at the receiver end of the bus. This is referred to as an "error detection signature" ("S") and is compared to the expected signature. When SE and S are different, it is assumed that there is an error in the received data and the data is retransmitted. Contrary to expectation, however, when SE and S are equal this does not necessarily indicate that the transmission was error-free. This is due to the fact that error detection probability generally decreases as the complexity of the error detection method decreases.

For example, in the prior art checksum method, groups of data words are summed without regard to overflow. As the following example demonstrates when an overflow occurs, otherwise detectable errors may be lost.

Assume that a data set comprises three four-bit words "A", "B" and "C". Let A = "1000", B = "0100", and C = "0010". The checksum expected signature SE for the set A, B, C is:

|  |  |
|---|---|
|   | A "1000" |
| + | B "0100" |
| + | C "0010" |
|   | SE "1110" |

Assume now that due to problems with the data bus, the most significant bit ("MSB") of each word is "stuck" at "1". This will not affect A but will cause errors in the received values of B and C. Denoting the received data words A', B', C' respectively, the error correction signature S' is computed as follows:

|  |  |
|---|---|
|   | A' "1000" |
|   | B' "1100" |
| + | C' "1010" |
|   | S' "1110" |

Thus, despite a significant error in the received data, SE and S' are equal and no error will be detected.

In the prior art CRC ("cyclic redundancy code") method known sequences of words are divided by a polynomial constant and the remainders thereof accumulated to form an expected signature. See for example, Scewiorek and Swarz, "The Theory & Practice of Reliable System Design", pp. 101 et. seq., Digital Press, 1982. The principal disadvantage with the CR method is that the signatures it produces are dependent upon the order in which the data words are sent. The sequence ABCD produces a different signature then BACD. Thus, for example, this method would cause difficulties in a graphics system in which the sequence that data is read from graphics circuitry to produce pixels on the display can vary.

It is therefore desirable to provide an error detection signature apparatus and method that has higher error detection probabilities than the prior art and will detect errors independent of the order in which data words are sent, but is relatively uncomplicated and easy to implement. The present invention achieves these goals.

SUMMARY OF THE INVENTION

According to the invention, there is provided a method and apparatus for generating an expected signature and an error detection signature in a system of the type for transferring N bit data words from a source (or source end of a communication medium) to a receiver, over a communications medium. A preferred method according to the invention comprises the following steps:

(a) Generating an expected signature SE at the source end by summing, in modulo $2^N$ arithmetic, data words to be transferred from the source by accumulating the data words in N bit locations of a first N+1 bit register. The contents of this first N+1 bit register define SE. Any carry outs ("COs") generated by the summation process are stored in a reserved one of the N+1 bit locations;

(b) Generating an error detection signature S at the receiver end by summing, in modulo $2^N$ arithmetic, data words received from the source by accumulating the received data words in N bit locations of a second N+1 bit register. The contents of this second N+1 bit register define S. As in step (a), any COs are stored in a reserved one of the N+1 bit locations; and, (c) Comparing S and SE, and detecting whether any discrepancy exists therebetween. If a discrepancy exists, it is assumed that an error has occurred in the data transfer, and an appropriate indication is provided.

The method and apparatus of the present invention detects discrepancies in the data transfer irrespective of the order in which the data words are transferred from the source.

Preferred apparatus for generating SE and S comprise substantially identical circuitry located at the source and receiver ends of the communications medium, respectively. Circuitry for carrying out the invention comprises an adder, for summing the data words to be transferred, coupled to an N+1 bit register for storing an N bit sum and a carry out from the adder. The contents of the N+1 bit register define either S or SE, depending upon whether the register is located at the source or receiver end of the communications medium.

The adder comprises:

(a) a first input port for receiving a first N or N+1 bit data word;

(b) a second input port, coupled to the N+1 bit register, for receiving a second N or N+1 bit data word from the N+1 bit register;

(c) an output port, coupled to the N+1 bit register, for providing the sum of the first and second N or N+1 bit data words to the N+1 bit register; and, (d) a carry port, coupled to the N+1 bit register, for providing any COs to a reserved bit of the N+1 bit register.

The N+1 bit register comprises N bits for storing the sum of the first and second N or N+1 bit data words (i.e., SE or S), and a reserved bit for storing any COs. The CO bit location can be considered part of the signature. Most preferably, N will be a power of two, e.g., 2, 4, 8, 16, 32 etc., and the communications medium will be an N bit data bus, however the invention is not limited to values of N that are powers of two.

DETAILED DESCRIPTION OF PREFERRED EMBODIMENTS

Preferred embodiments of apparatus for producing error detection signatures according to the invention will now be discussed with reference to the drawings, wherein like numerals designate like elements.

Figure 1:
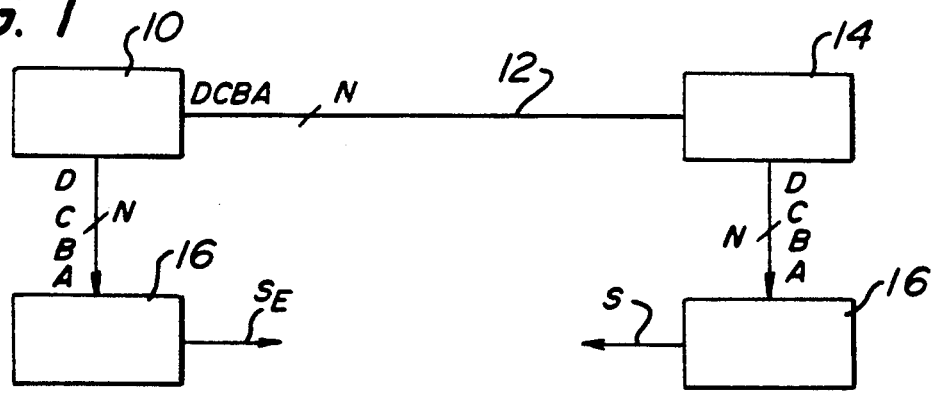
FIG. 1 is a simplified block diagram of an exemplary data transfer system employing an error detection method and apparatus according to the present invention.

Referring now to FIG. 1, there is illustrated a system wherein N bit data words (N being an integer and preferably a power of two, e.g., 4, 8, 16, 32, etc.) are transferred from a source 10 to a receiver 14 over an N bit channel or bus 12. Source 10 and receiver 14 may each be distinct computers, or may be separate processors within a single computer system. For example, source 10 may be a pixel processor for processing pixel data to be supplied to a graphics monitor, and receiver 14 may represent a device for performing mathematical calculations on the graphical data. The invention comprises means by which a discrepancy, if any, between the data sent from source 10 and the data received by receiver 14 may be detected.

According to the invention, apparatus 16 are provided for producing an expected signature SE at the source end of bus 12 and an error detection signature S at the receiver end of the bus 12. SE is derived, by methods explained below, from a set of data words 20 as the words are serially sent from source 10 to receiver 14. For example, assume that four data words "A", "B", "C" and "D" are being transferred serially from source 10 to receiver 14. For simplicity, assume that A, B, C and D are each four-bit words (i.e., N = 4). As A, B, C, and D are successively sent from source 10 over bus 12, they are simultaneously provided to signature apparatus 16 which computes an expected signature SE by methods according to the invention. Expected signature SE will be N+1 bits wide (in this example, five bits) and will be continuously updated as words A, B, C, D etc. are sent down the bus 12. According to the invention, signature apparatus 16 are provided at both the source end 10 of the bus and at the receiver end 14 of the bus. As expected signature SE is computed from data set 20, (comprising words A, B, C, D, for example), error detection signature S is computed from received data set 20'. If there is no error, i.e., no difference between the sent and received data sets 20 and 20' respectively, S and SE will be equal. If there is an error, S and SE will be different and appropriate action, such as retransmitting the data, can be taken.

Two alternative preferred methods and corresponding apparatus for producing signatures S and SE are disclosed herein. For obvious reasons, the same method should be used within a given system. These alternative methods and apparatus are discussed next with reference to FIGS. 2 and 3, respectively.

Figure 2:
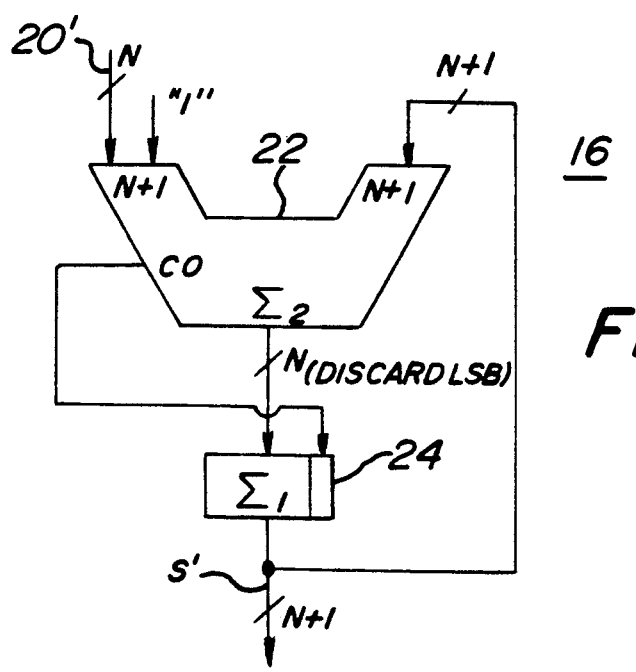
FIG. 2 is a block diagram of apparatus for generating an error detection signature according to the invention.

Referring now to FIG. 2, a first preferred embodiment of apparatus 16 for producing expected signature SE and error detection signature S comprises N+1 bit adder 22 and N+1 bit signature register 24. Adder 22 cumulatively adds, using modulo $2^N$ arithmetic, the contents of signature register 24 to the respective words A, B, C, D etc. of incoming data set 20'. The respective sums ($\epsilon_2$) are stored in signature register 24. The contents of signature register 24 will be either expected signature SE or error detection signature S, depending upon whether it is located at source 10 or receiver 14. S and SE are therefore hereinafter generically referred to as $\epsilon_1''$. In the embodiment of FIG. 2, a bit with a value of "1" is appended to the right of the least significant bit ("LSB") of the incoming data set 20'. For example, if a four-bit word A= "1000" is provided, then adder 22 will receive the bits "10001". Similarly, if a four bit word B = "0100" is provided, adder 22 will receive "01001". According to the invention, as successive words are summed, the results are stored in signature register 24. Before the result is stored, however, the LSB of the result is discarded. Any carry-outs ("CO") from the MSB are stored in the LSB of signature register 24, i.e., in the LSB of $\epsilon_1$. In this manner, the overflow problem of the prior art is solved. What's more, the signature produced for a given data set 20 or 20' will be independent of the precise order in which the individual data words are sent. In other words, the signature of ABCD will be the same as the signature of BACD, BCAD, etc. The following example illustrates application of the method under discussion.

Assume the data set A, B, C, D is sent from source 10 to receiver 14 over bus 12 and that A, B, C, D have the following values:

A = "1000"
B = "0100"
C = "0010"
D = "0001"

Initially S and SE are both zero, or "0000:0". The following table shows how the expected signature SE is computed as the words, A, B, C, D are successively added. In the table, "$\epsilon_1$", represents the current contents of signature register 24 and "$\epsilon_2$" represents the contents of adder 22 after the respective data words are added.

The extra bit appended to the incoming data words are separated below by a colon (":38").

|   | DATA    | + $\Sigma_1$ | = $\Sigma_2$ |
|---|---------|--------------|--------------|
| A | 1000:1  | 0000:0       | 1000:1       |
| B | 0100:1  | 1000:0       | 1100:1       |
| C | 0010:1  | 1100:0       | 1110:1       |
| D | 0001:1  | 1110:0       | 1111:1       |
| SE|         | 1111:0       |              |

Thus, the expected signature SE for data set ABCD is "1111:0". Note that as a sum is transferred from adder 22 to signature register 24 the LSB is discarded and any carry-outs CO are stored in the LSB of signature register 24. (There were no carry-outs in the above example.) Moreover, this result is independent of the order in which the words are sent.

Now assume that due to a problem with bus 12, the MSB of each of the words A, B, C, D is "stuck" at "1". The data set 20, from which the error detection signature S will be derived comprises A', B', C' and D':

|    | DATA    | + $\Sigma_1$ | = $\Sigma_2$  |
|----|---------|--------------|---------------|
| A' | 1000:1  | 0000:0       | 1000:1        |
| B' | 1100:1  | 1000:0       | 0100:1 + CO   |
| C' | 1010:1  | 0100:1       | 1111:0        |
| D' | 1001:1  | 1111:0       | 1000:1 + CO   |
| S' |         | 1000:1       |               |

The error detection signature S' is thus "1000:1". Since this is different than the expected signature SE (="1111:0"), by comparing SE and S' a signal may be provided indicating that the received data set is invalid.

Figure 3:
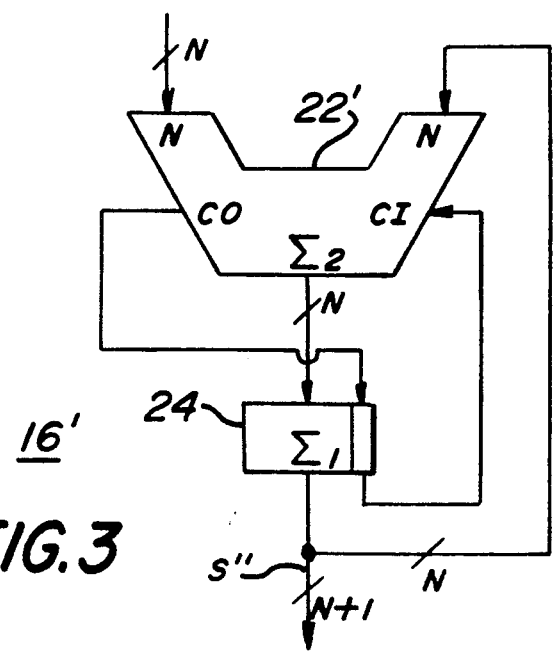
FIG. 3 is a block diagram of an alternative apparatus for generating an error detection signature according to the invention.

A second alternative method and apparatus for producing the expected signature SE and the error detection signature S and S' (S and S' representing error detection signatures with and without errors respectively) is illustrated in FIG. 3. Apparatus 16' comprises N bit adder 22' and N+1 bit register 24. Both adder 22 of FIG. 2 and adder 22' of FIG. 3 perform modulo $2^n$ arithmetic (e.g., modulo 16 for N=4). Adder 22 shifts the incoming data words to the left one bit and adds a "1" to the LSB. The LSB of the resulting N+1 bit sum is discarded as the sum is stored in signature register 24. Only when there is a carry is the LSB of register 24 set. The alternative method of FIG. 3 does not involve appending an extra "1" bit to the incoming data words. In the embodiment of FIG. 3, the LSB of the signature register 24 is provided as a carry in (CI) to the adder 22', as shown. All COs are still stored in the LSB of register 24. In both FIGS. 2 and 3, the CO bit location can be considered to be part of the signature. The following example illustrates the method of FIG. 3.

As before, assume A ="1000", B ="0100", C ="0010" and D ="0001". The following table illustrates how the apparatus of FIG. 3 computes the expected signature SE as the words A, B, C, D are sent down bus 12.

|    | DATA | + $\Sigma_1$ | = $\Sigma^2$ |
|----|------|--------------|--------------|
| A  | 1000 | 0000:0       | 1000:0       |
| B  | 0100 | 1000:0       | 1100:0       |
| C  | 0010 | 1100:0       | 1110:0       |
| D  | 0001 | 1110:0       | 1111:0       |
| SE |      | 1111:0       |              |

Again the expected signature SE is "1111:0". Assuming once again that the MSB of bus 12 is stuck at "1", the following table indicates the contents of adder 22' ($\epsilon_2$) and signature register 24 ($\epsilon_1$) as words A', B', C' and D' are received, respectively, by receiver 14.

|    | DATA | + $\Sigma_1$ | = $\Sigma_2$         |
|----|------|--------------|----------------------|
| A' | 1000 | 0000:0       | 1000                 |
| B' | 1100 | 1000:0       | 0100 + CO            |
|    |      |              | (CO stored in LSB)   |
| C' | 1010 | 0100:1       | 1110:1               |
| D' | 1001 | 1111:0       | 1000 + CO            |
|    |      |              | (CO stored in LSB)   |
| S' |      | 1000:1       |                      |

The error detection signature S' is therefore "1000:1". When this is compared with SE ="1111:0" an error will be indicated.

Comparison of the two alternative methods herein described with the checksum and CRC methods of the prior art illustrates that the invention provides a higher probability of error detection than the checksum method while maintaining the simplicity of that method. Moreover, the invention provides order-independent signatures not available with the more complex CRC method.

The present invention may be embodied in any specific forms without departing from the spirit or essential attributes thereof and, accordingly reference should be made to the appended claims rather than to the foregoing specification, as indicating the scope of the invention.

What is claimed is:

1. In a system of the type wherein a set of N bit data words are transferred from a source end to a receiver end over a communications medium, a method for detecting errors in received data words comprising the steps of:
    (a) summing, in modulo $2^N$ arithmetic, data words to be transferred from the source end by accumulating the data words in N bit locations of a first N+1 bit register while storing any carry outs ("COs") in a reserved one of the N+1 bit locations, the contents of the first N+1 bit register defining an expected signature SE;
    (b) summing, in modulo $2^n$ arithmetic, data words received from the source end by accumulating the received data words in N bit locations of a second N+1 bit register while storing any COs in a reserved one of the N+1 bit locations of the second N+1 bit register, the contents of the second N+1 bit register defining an error detection signature S; and,
    (c) comparing S and SE, and detecting whether a discrepancy exists therebetween, and providing an indication that an error has occurred in the data transfer when a discrepancy is detected,
    discrepancies in the received data words being detected irrespective of the order in which the data words are transferred from the source end.

2. Method of claim 1 wherein step (a) further comprises appending a bit of value of "1" to the N bits of the data words to be transferred from the source end.

3. Method of claim 1 wherein step (b) further comprises appending a bit of value of "1" to the N bits of the data words received from the source end.

4. Method of claim 1 wherein N is a power of two.

5. In a system of the type wherein a set of N bit data words are transferred from a source and to a receiver end over a communications medium, apparatus for detecting errors in received data words comprising:
  (a) first means for summing, in modulo $2^N$ arithmetic, data words to be transferred from the source end by accumulating the received data words in N bit locations of a first N+1 bit register and storing any carry outs ("COs") in a reserved one of the N+1 bit register defining an expected signature SE;
  (b) second means for summing, in modulo $2^N$ arithmetic, data words received from the source end by accumulating the received data words in N bit locations of a second N+1 bit register and storing any COs in a reserved one of the N+1 bit locations of the second N+1 bit register, the contents of the second N+1 bit register defining an error detection signature S; and,
  (c) third means for comparing the error detection signature and expected signature and detecting whether any discrepancy exits therebetween, and providing an indication that an error has occurred in the data transfer when a discrepancy is detected, discrepancies in the received data words being detected irrespective of the order in which the data words are transferred from the source end.

6. Apparatus of claim 5 wherein the source and receiver ends of the communication medium comprise separate processors within the system.

7. Apparatus of claim 5 wherein the source end of the communication medium comprises a pixel processor.

8. Apparatus of claim 5 wherein the receiver end of the communication medium comprises a device for performing mathematical calculations.

9. Apparatus of claim 5 wherein the communication medium comprises an N bit bus.

10. Apparatus of claim 5 wherein the first means appends a bit of value of "1" to the N bits of the data words to be transferred from the source end.

11. Apparatus of claim 5 wherein the second means appends a bit of value of "1" to the N bits of the data words received from the source end.

12. In a system of the type for transferring N bit data words from a source to a receiver over a communication medium, apparatus comprising:
  (a) an adder for summing, using modulo $2^N$ arithmetic, the data words to be transferred;
  (b) an N+1 bit register coupled to an output port of the adder for receiving and storing N bits of the sum of the data words and a carry out provided by the adder; the adder comprising:
    (i) a first input port for receiving a first N bit data word;
    (ii) a second input port coupled to an output port of the N+1 bit register for receiving a second N+a bit data word from the output port of the N+1 bit register;
    the output port of the adder being coupled to a first input port of the N+a bit register for providing the N bits of the sum to the N+1 bit register; and,
    (iii) a carry out port coupled to a second input port of the N+1 bit register for providing the carry out provided by the adder.

13. Apparatus according to claim 12 wherein the first input port of the adder receives, in addition to the N bit data words, an additional bit value of "1" for appending to the N bit data words received at the first input port.

14. Apparatus according to claim 12 wherein the second input port of the N+1 bit register is an LSB bit location.

15. In a system of the type for transferring N bit data words from a source to a receiver over a communication medium, apparatus comprising:
  (a) an adder for summing, using modulo $2^N$ arithmetic, the data words to be transferred;
  (b) an N+1 bit register coupled to an output port of the adder for receiving and storing an N bit sum of the data words and a carry out provided by the adder;
  the adder comprising:
    (i) a first input port for receiving a first N bit data word;
    (ii) a second input port coupled to a first output port of the N+1 bit register for receiving a second N bit data word from the first output port of the N+1 bit register;
    the output port of the adder being coupled to a first input port of the N+1 bit register for providing the N bit sum to the N+1 bit register;
    (iii) a carry out port coupled to a second input port of the N+1 bit register for providing the carry out provided by the adder; and
    (iv) a carry in port coupled to a second output port of the N+1 bit register for receiving the carry out received at the second input port of the N+1 bit register.

16. Apparatus according to claim 15 wherein the second input port of the N+1 bit register is an LSB bit location.

* * * * *

UNITED STATES PATENT AND TRADEMARK OFFICE
CERTIFICATE OF CORRECTION

PATENT NO. : 5,121,397
DATED : June 9, 1992
INVENTOR(S) : Forrest E. Norrod

It is certified that error appears in the above-identified patent and that said Letters Patent is hereby corrected as shown below:

Column 6, line 47, "2" " should read --$2^N$--;

Column 7, line 2, "and" should read --end--;

Column 7, line 11, after "bit" "locations of the first N+1 bit register, the contents of the first N+1 bit register" omitted;

Column 8, line 6, "a" should read "1";

Column 8, line 10, "a" should read "1".

Signed and Sealed this

Twenty-first Day of June, 1994

BRUCE LEHMAN

Attest:

Attesting Officer          Commissioner of Patents and Trademarks